United States Patent
Pickel

(10) Patent No.: US 12,191,422 B2
(45) Date of Patent: Jan. 7, 2025

(54) OPTOELECTRONIC SEMICONDUCTOR COMPONENT COMPRISING CONNECTION REGIONS, AND METHOD FOR PRODUCING THE OPTOELECTRONIC SEMICONDUCTOR COMPONENT

(71) Applicant: OSRAM Opto Semiconductors GmbH, Regensburg (DE)

(72) Inventor: Sebastian Pickel, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 470 days.

(21) Appl. No.: 17/614,119

(22) PCT Filed: May 26, 2020

(86) PCT No.: PCT/EP2020/064543
§ 371 (c)(1),
(2) Date: Nov. 24, 2021

(87) PCT Pub. No.: WO2020/239749
PCT Pub. Date: Dec. 3, 2020

(65) Prior Publication Data
US 2022/0231195 A1 Jul. 21, 2022

(30) Foreign Application Priority Data
May 27, 2019 (DE) .................. 10 2019 114 169.9

(51) Int. Cl.
*H01L 33/08* (2010.01)
*H01L 33/00* (2010.01)
*H01L 33/38* (2010.01)

(52) U.S. Cl.
CPC ........ *H01L 33/382* (2013.01); *H01L 33/0075* (2013.01); *H01L 33/08* (2013.01)

(58) Field of Classification Search
CPC .... H01L 33/382; H01L 33/0075; H01L 33/08
(Continued)

(56) References Cited

U.S. PATENT DOCUMENTS 6,239,035 B1 * 5/2001 Harris ............... H01L 21/76801
438/761
2009/0159910 A1 * 6/2009 Lin ......................... H01L 33/22
257/E33.074

(Continued)

FOREIGN PATENT DOCUMENTS

| CN | 107810564 A | 3/2018 | |
| CN | 107851688 A | 3/2018 | |
| CN | 107112389 B * | 6/2019 | ............. H01L 33/22 |
| DE | 102016102876 A1 | 8/2017 | |
| EP | 2381493 A2 * | 10/2011 | ............. H01L 33/22 |
| WO | 2015189056 A2 | 12/2015 | |

OTHER PUBLICATIONS

Gijsbertsen, Hans, International Search Report (with English Translation) and Written Opinion in corresponding International Application No. PCT/EP2020/064543 mailed on Sep. 3, 2020, 12 pages.

*Primary Examiner* — Phuc T Dang
(74) *Attorney, Agent, or Firm* — MH2 Technology Law Group LLP

(57) ABSTRACT

The invention relates to an optoelectronic semiconductor component, comprising a first semiconductor layer stack, which comprises a first semiconductor layer of a first conductivity type and a second semiconductor layer of a second conductivity type. The optoelectronic semiconductor component additionally has a first contact element and a second contact element. The first semiconductor layer stack and the second semiconductor layer are arranged one above the other. The second semiconductor layer is electrically connected to the second contact element. A part of a first main surface of the first semiconductor layer stack adjoins the first contact element, and a part of the first main surface of the first semiconductor layer stack is structured such that both a plurality of protruding regions as well as connection (Continued)

regions are formed. The connection regions adjoin regions in which a part of the first main surface of the first semiconductor layer stack adjoins the first contact element, and the connection regions have a lateral extension which is greater than five times the average lateral extension of the protruding regions.

18 Claims, 6 Drawing Sheets

(58) Field of Classification Search
USPC .......................................................... 257/99
See application file for complete search history.

(56) References Cited

U.S. PATENT DOCUMENTS

| | | |
|---|---|---|
| 2016/0087158 A1 | 3/2016 | Lim et al. |
| 2017/0092808 A1 | 3/2017 | Perzlmaier et al. |
| 2017/0148966 A1 | 5/2017 | Schwartz et al. |
| 2017/0256681 A1* | 9/2017 | Liao ........................ H01L 33/42 |
| 2018/0138370 A1* | 5/2018 | Shin ........................ H01L 33/42 |
| 2018/0190874 A1 | 7/2018 | Katz et al. |
| 2018/0204876 A1 | 7/2018 | Perzlmaier et al. |
| 2018/0219131 A1 | 8/2018 | Park et al. |
| 2019/0067516 A1* | 2/2019 | Tu ........................... H01L 33/18 |
| 2019/0115502 A1 | 4/2019 | Ito |

* cited by examiner

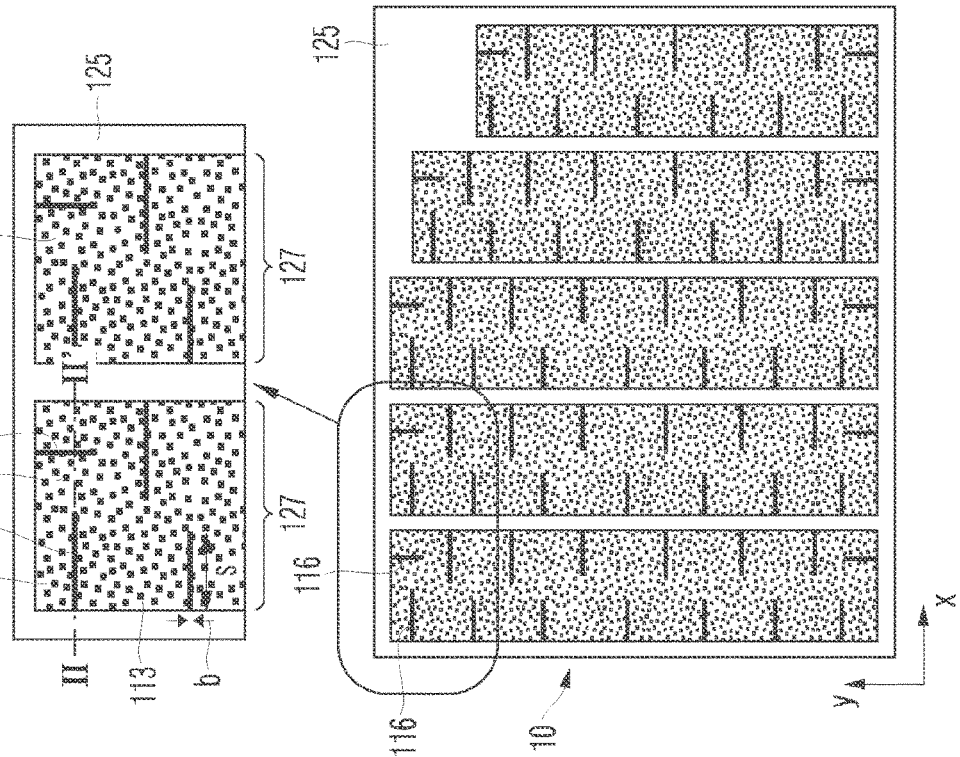
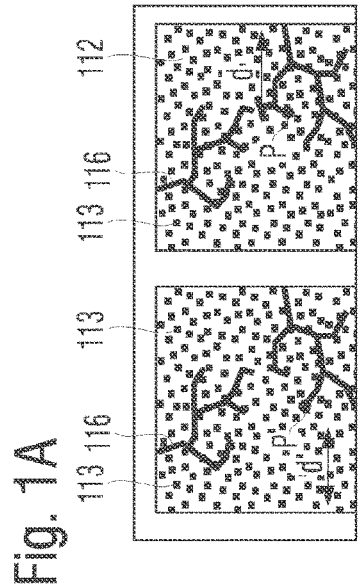
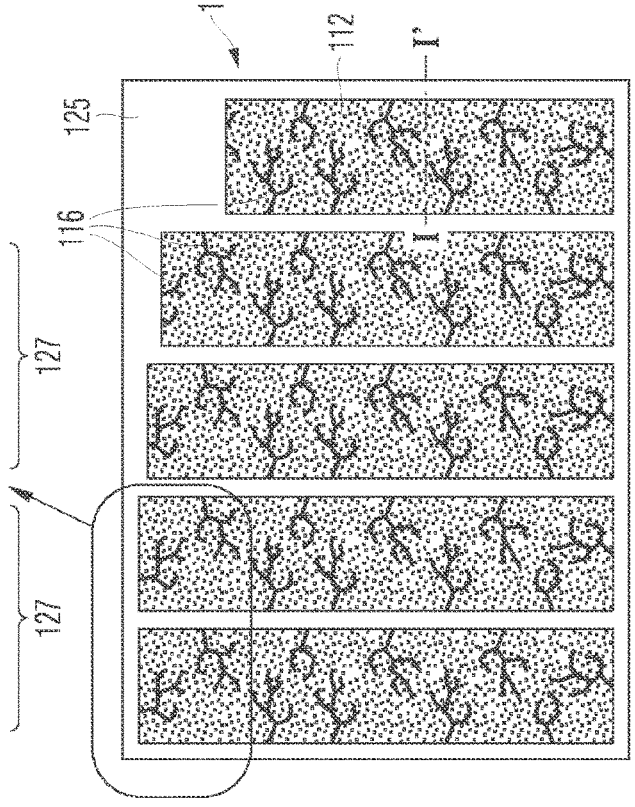
Fig. 1A
Fig. 1B

OPTOELECTRONIC SEMICONDUCTOR COMPONENT COMPRISING CONNECTION REGIONS, AND METHOD FOR PRODUCING THE OPTOELECTRONIC SEMICONDUCTOR COMPONENT

CROSS-REFERENCE TO RELATED APPLICATIONS

This patent application is a national stage entry from International Application No. PCT/EP2020/064543, filed on May 26, 2020, published as International Publication No. WO 2020/239749 A1 on Dec. 3, 2020, and claims the priority of German patent application DE 10 2019 114 169.9, filed May 27, 2019, the disclosure contents of all of which are incorporated herein by reference.

BACKGROUND

A light emitting diode (LED) is a light emitting device based on semiconductor materials. An LED typically comprises differently doped semiconductor layers and an active zone. When electrons and holes recombine with one another in the regions of the active zone, due, for example, to a corresponding voltage being applied, electromagnetic radiation is generated.

In general, concepts are being sought by means of which electrical contacting of the semiconductor layers may be improved.

The object of the present invention is to provide an improved optoelectronic semiconductor device and an improved method for manufacturing an optoelectronic semiconductor device.

According to the present invention, the object is achieved by the subject matter and the method of the independent claims. Advantageous enhancements are defined in the dependent claims.

SUMMARY

An optoelectronic semiconductor device comprises a first semiconductor layer stack comprising a first semiconductor layer of a first conductivity type and a second semiconductor layer of a second conductivity type. The optoelectronic semiconductor device further comprises a first contact element and a second contact element, the first semiconductor layer stack and the second semiconductor layer being arranged one above the other and the second semiconductor layer being electrically connected to the second contact element. Part of a first main surface of the first semiconductor layer stack is adjacent to the first contact element, and part of the first main surface of the first semiconductor layer stack is patterned so that a plurality of protruding regions and a plurality of connecting regions are formed. The connecting regions are adjacent to regions in which part of the first main surface of the first semiconductor layer stack is adjacent to the first contact element, and have a lateral extension which is greater than 5 times the mean lateral extension of the protruding regions.

In this context, the lateral extension of the connection areas is to be understood as a lateral extension of that part of the connecting regions which is not adjacent to the first contact element. This part of the connecting region may thus be present in a light-emitting region that is not covered by the first contact element.

According to further embodiments, the connecting regions may also have a lateral extension which is greater than 10 times the mean lateral extension of the protruding regions.

For example, when determining the mean lateral extension of the protruding regions, averaging may be performed over those protruding regions that are not directly adjacent to the first contact element nor to regions of the first main surface in which part of the first main surface of the first semiconductor layer stack is directly adjacent to the first contact element. For example, depressions may be formed within the semiconductor layer stack which separate the protruding regions from the first contact element or from regions of the first main surface adjacent to the first contact element.

According to embodiments, the first contact element comprises an electrically conductive material. Part of that part of the first main surface that is patterned is not adjacent to the first contact element and represents a light emitting region.

For example, the connecting regions extend from the first contact element into the light emitting regions, respectively. For example, the first contact element encloses the light emitting region.

According to embodiments, at least one of the connecting regions extends up to a position within the light emitting region from which a distance to a closest part of the first contact element is greater than a third of a smallest diameter of the light emitting region.

According to embodiments, an outermost semiconductor layer of the first semiconductor layer stack is at least partially removed or thinned in the light emitting region. That is to say, the outermost semiconductor layer may be patterned such that it is completely removed or thinned in certain regions, which may be defined photolithographically, for example. According to embodiments, the outermost semiconductor layer may also be completely removed from the light emitting region.

For example, a lateral extension of the connecting regions in a direction perpendicular to an extension direction may be greater than a mean lateral extension of the protruding regions. According to embodiments, a structural height of one of the connecting regions may be greater than half a mean lateral extension of the protruding regions.

According to embodiments, the first semiconductor layer stack may comprise phosphide semiconductor layers, and the outermost first semiconductor layer contains a phosphide semiconductor material.

According to further embodiments, a semiconductor material of the first semiconductor layer stack may comprise a nitride or arsenide semiconductor material.

For example, a regions between two protruding regions may have a vertical depth greater than 500 nm and less than 3 μm.

According to embodiments, a method for manufacturing an optoelectronic semiconductor device comprises forming a first semiconductor layer stack comprising first semiconductor layers of a first conductivity type and a second semiconductor layer of a second conductivity type. The method further comprises forming a first contact element and a second contact element, the first semiconductor layer stack and the second semiconductor layer being arranged one above the other. The second semiconductor layer is electrically connected to the second contact element. Part of a first main surface of the first semiconductor layer stack is adjacent to the first contact element. Part of the first main surface of the first semiconductor layer stack is patterned, so that a plurality of protruding regions and a plurality of connecting regions are formed. The connecting regions are adjacent to regions in which part of the first main surface of the first semiconductor layer stack is adjacent to the first contact element, and have a lateral extension that is greater than 5 times the mean lateral extension of the protruding regions.

For example, patterning may be carried out photolithographically using a photo mask.

The method may further comprise removing at least part of an outermost layer of the semiconductor layer stack. For example, the outermost layer of the semiconductor layer stack may be removed or thinned in predetermined regions. The predetermined regions may be defined photolithographically, for example. According to embodiments, the outermost layer may also be completely removed from the light emitting region.

According to further embodiments, an optoelectronic semiconductor device comprises a first semiconductor layer stack comprising a first semiconductor layer of a first conductivity type and an epitaxial connecting layer, as well as a second semiconductor layer of a second conductivity type. The optoelectronic semiconductor device further comprises a first contact element and a second contact element. The first semiconductor layer stack and the second semiconductor layer are arranged one above the other. The second semiconductor layer is electrically connected to the second contact element. Part of a first main surface of the first semiconductor layer stack is adjacent to the first contact element, and part of the first main surface of the first semiconductor layer stack is patterned so that a plurality of protruding regions and a plurality of connecting regions are formed. Part of that part of the first main surface that is patterned is not adjacent to the first contact element and represents a light emitting region. The connecting regions extend from the first contact element into the light emitting region, respectively.

For example, the connecting regions are adjacent to regions in which part of the first main surface of the first semiconductor layer stack is adjacent to the first contact element.

BRIEF DESCRIPTION OF THE DRAWINGS

The accompanying drawings serve to provide an understanding of exemplary embodiments of the invention. The drawings illustrate exemplary embodiments and, together with the description, serve for explanation thereof. Further exemplary embodiments and many of the intended advantages will become apparent directly from the following detailed description. The elements and structures shown in the drawings are not necessarily shown to scale relative to each other. Like reference numerals refer to like or corresponding elements and structures.

FIG. 1A is a schematic plan view of regions of an optoelectronic semiconductor device according to embodiments.

FIG. 1B is a schematic plan view of regions of an optoelectronic semiconductor device according to further embodiments.

DETAILED DESCRIPTION

Figure 2A:
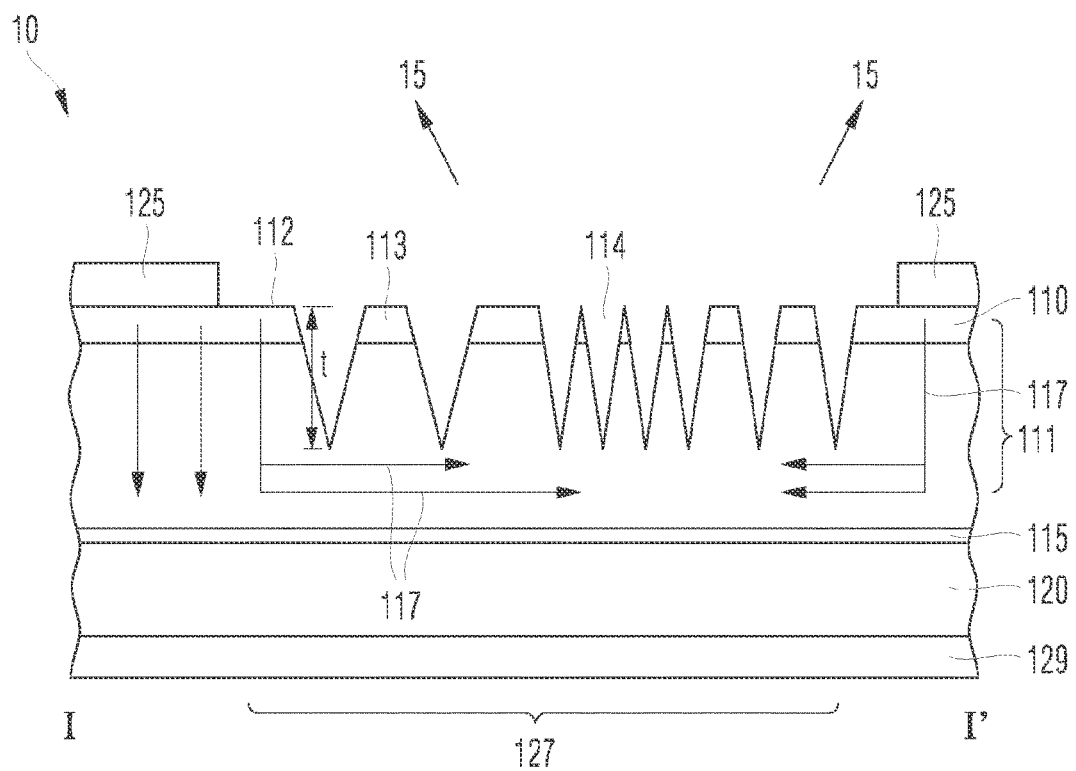
FIG. 2A shows a schematic cross-sectional view of part of an optoelectronic semiconductor device.

In the following detailed description, reference is made to the accompanying drawings, which form a part of the disclosure and in which specific exemplary embodiments are shown for purposes of illustration. In this context, directional terminology such as "top", "bottom", "front", "back", "over", "on", "in front", "behind", "leading", "trailing", etc. refers to the orientation of the figures just described. As the components of the exemplary embodiments may be positioned in different orientations, the directional terminology is used by way of explanation only and is in no way intended to be limiting.

The description of the exemplary embodiments is not limiting, since there are also other exemplary embodiments, and structural or logical changes may be made without departing from the scope as defined by the patent claims. In particular, elements of the exemplary embodiments described below may be combined with elements from others of the exemplary embodiments described, unless the context indicates otherwise.

The terms "lateral" and "horizontal", as used in the present description, are intended to describe an orientation or alignment which extends essentially parallel to a first surface of a semiconductor substrate or semiconductor body. This may be the surface of a wafer or a chip (die), for example.

The horizontal direction may, for example, be in a plane perpendicular to a direction of growth when layers are grown.

The term "vertical", as used in this description, is intended to describe an orientation which is essentially perpendicular to the first surface of a substrate or semiconductor body. The vertical direction may correspond, for example, to a direction of growth when layers are grown.

The terms "wafer" or "semiconductor substrate" used in the following description may include any semiconductor-based structure that has a semiconductor surface. Wafer and structure are to be understood to include doped and undoped semiconductors, epitaxial semiconductor layers, supported by a base, if applicable, and further semiconductor structures. For example, a layer of a first semiconductor material may be grown on a growth substrate made of a second semiconductor material, for example GaAs, GaN or Si, or of an insulating material, for example sapphire.

Depending on the intended use, the semiconductor may be based on a direct or an indirect semiconductor material. Examples of semiconductor materials particularly suitable for generating electromagnetic radiation include, without limitation, nitride semiconductor compounds, by means of which, for example, ultraviolet, blue or longer-wave light may be generated, such as GaN, InGaN, AlN, AlGaN, AlGaInN, AlGaInBN, phosphide semiconductor compounds by means of which, for example, green or longer-wave light may be generated, such as GaAsP, AlGaInP, GaP, AlGaP, and other semiconductor materials such as GaAs, AlGaAs, InGaAs, AlInGaAs, SiC, ZnSe, ZnO, $Ga_2O_3$, diamond, hexagonal BN and combinations of the materials mentioned. The stoichiometric ratio of the compound semiconductor materials may vary. Other examples of semiconductor materials may include silicon, silicon germanium, and germanium. In the con text of the present description, the term "semiconductor" also includes organic semiconductor materials.

The term "substrate" generally includes insulating, conductive or semiconductor substrates.

To the extent used herein, the terms "have", "include", "comprise", and the like are open-ended terms that indicate the presence of said elements or features, but do not exclude the presence of further elements or features. The indefinite articles and the definite articles include both the plural and the singular, unless the context clearly indicates otherwise.

In the context of this description, the term "electrically connected" means a low-ohmic electrical connection between the connected elements. The electrically connected elements need not necessarily be directly connected to one another. Further elements may be arranged between electrically connected elements.

The term "electrically connected" also encompasses tunnel contacts between the connected elements.

FIG. 1A shows a schematic plan view of part of an optoelectronic semiconductor device 10 according to embodiments. The upper part of FIG. 1A shows an enlarged view of part of the surface of the optoelectronic semiconductor device 10 shown in the lower part of FIG. 1A.

FIG. 1A shows a plan view of a first main surface 112 of the optoelectronic semiconductor device. For example, the electromagnetic radiation 15 generated by the optoelectronic semiconductor device 10 may be emitted via the first main surface 112. For example, the first main surface 112 simultaneously represents a first main surface of a first semiconductor layer stack, which will be explained in more detail with reference to FIG. 2A. A first contact element 125 is disposed over part of the first main surface 112. For example, the first contact element 125 is connected to layers of the first semiconductor layer stack. That part of the first main surface 112 which is not covered with the first contact element 125 may act as a light emitting region 127, for example. For example, the first contact element 125 may at least partially or completely surround a light emitting region 127. As shown in particular in the enlarged region of FIG. 1A, the first main surface 112 of the semiconductor layer stack comprises a plurality of protruding regions 113. Furthermore, a plurality of connecting regions 116 is formed. The connecting regions 116 may be linear and may each comprise straight portions.

The connecting regions 116 are adjacent to regions in which part of the first main surface of the first semiconductor layer stack is adjacent to the first contact element. The connecting regions 116 are thus electrically connected to the first contact element 125 via these regions. The connecting regions 116 have a lateral extension which is greater than 5 times the mean lateral extension of the protruding regions. The connecting regions 116 may be formed in a straight line, as shown in FIG. 1B. However, the connecting regions 116 do not necessarily have to be straight. The connecting regions 116 may, for example, also be curved or composed of several straight regions lined up in a row. The term "lateral extension" denotes a length of the connecting regions 116 in a horizontal plane. In the case of curved connecting regions 116, this may be the arc length, for example. In the case of connecting areas 116 composed of several straight areas lined up in a row, this may be, for example, the sum of the individual distances.

According to further embodiments, the connecting regions 116 may have a horizontal dimension (i.e., width) in a direction perpendicular to an extension direction which is greater than the mean horizontal dimension of the protruding regions 113.

As shown in FIG. 1A, the connecting regions 116 may have several branches. In this manner, efficient lateral current spreading is achieved. For example, the first contact element may comprise an electrically conductive material. The connecting regions 116 are arranged in the light emitting region 127 and extend from the first contact element 125 into the interior of the light emitting region 127.

For example, the material of the first contact element may be a metal or a metal alloy or also comprise an electrically conductive metal oxide. The material of the first contact element 125 may be opaque or transparent. The material of the first contact element 125 may be an Au—Ge alloy, for example.

The connecting regions 116 may each extend from the first contact element 125 into the light emitting region 127. It is provided that the current is impressed into the first semiconductor layer stack via the first contact elements 125 and the connecting regions 116.

For example, the connection regions 116 may extend from the first contact element 125 in the direction of a center point or a central region of the light emitting region 127. For example, the light emitting region 127 may each be formed to be rectangular and have a smaller diameter and a larger diameter. The connecting region 116 may extend up to a position P within the light emitting region 127, from which a distance d to a closest part of the first contact element 125 is greater than one third of a smallest diameter of the light emitting region. According to further embodiments, the distance from the position to the closest part of the first contact element 125 may be greater than one half of the smallest diameter of the light emitting region.

According to further embodiments, the light emitting region may have any other shape. In this case too, the connection region may extend up to a position within the light emitting region 127 from which a distance to a closest part of the first contact element 125 is greater than one third of a smallest diameter of the light emitting region 127. In this case too, according to further embodiments, the distance from the position to the closest part of the first contact element 125 may be greater than one half of the smallest diameter of the light emitting region.

For example, the light emitting region 127 may also have a square or some other shape having a center point. In this case, for example, the connecting region 116 may extend in the direction of the center point. According to further embodiments, the connecting region 116 may also extend in the direction of a center line which, for example, divides the light emitting region 127 into two regions of the same size and approximately the same shape. The connecting region may branch out several times. According to further embodiments, the connecting region 116 may also extend in the direction of the axis of symmetry of the light emitting region 127.

FIG. 1B shows a plan view of an optoelectronic semiconductor device in accordance with further embodiments. In principle, the optoelectronic semiconductor device and the connecting regions 116 are configured as illustrated in FIG. 1A. As shown in FIG. 1B and in contrast to FIG. 1A, the connecting region 116 may have the shape of a straight line and may, for example, extend at a right angle from the first contact element 125 into the light emitting region 127. As shown in FIG. 1B, for example, the connecting regions may be arranged at equal distances along a longitudinal direction of the light emitting region 127. For example, the light emitting region may each have a rectangular shape and the connecting regions are arranged along a longitudinal axis, for example the y-axis, wherein the connecting regions on the left side of the light emitting region 127 are offset from the connecting regions on the right-hand side of the light emitting region 127 and thus form a type of interdigital structure. In this manner, a particularly uniform power supply is made possible. The other components of FIG. 1B are similar to those of FIG. 1A.

As further illustrated in FIG. 1B, the connecting regions 116 have a lateral extension s which is greater than 5 times the mean lateral extension of the protruding regions 113. A width b, i.e., a lateral extension in a direction perpendicular to a extension direction, may, for example, be greater than a mean lateral extension of the protruding regions.

FIG. 2A shows a schematic cross-sectional view of an optoelectronic semiconductor device in accordance with embodiments. The cross-sectional view shown in FIG. 2A is arranged between I and I', as illustrated in FIGS. 1A and 1B.

The optoelectronic semiconductor device 10 shown in FIG. 2A comprises a first semiconductor layer stack 111 comprising a first semiconductor layer of a first conductivity type, for example n-type, and a second semiconductor layer of a second conductivity type, for example p-type. The optoelectronic semiconductor device 10 further comprises a first contact element 125 and a second contact element 129. The first semiconductor layer stack 111 and the second semiconductor layer 120 are arranged one above the other. The second semiconductor layer 120 is electrically connected to the second contact element 129. Part of a first main surface 112 of the first semiconductor layer stack 111 is directly adjacent to the first contact element 125 and part of the first main surface of the first semiconductor layer stack is patterned so that a plurality of protruding regions 113 and a plurality of the connecting regions 116 discussed above (not shown in FIG. 2A) are formed.

For example, an active zone 115 may be arranged between the first semiconductor layer stack 111 and the second semiconductor layer 120.

The active zone 115 may, for example, comprise a pn junction, a double heterostructure, a single quantum well structure (SQW, single quantum well) or a multiple quantum well structure (MQW, multi quantum well) for generating radiation. The term "quantum well structure" does not imply any particular meaning here with regard to the dimensionality of the quantization. Therefore it includes, among other things, quantum wells, quantum wires and quantum dots as well as any combination of these layers.

In optoelectronic semiconductor devices, the semiconductor layers, each of a different conductivity type, are usually composed of a plurality of individual semiconductor layers of different composition and layer thickness. The semiconductor layers are usually grown epitaxially. The optoelectronic semiconductor device described herein thus contains a first semiconductor layer stack 111 comprising a first semiconductor layer of a first conductivity type, and a second semiconductor layer 120 of a second conductivity type. The second semiconductor layer 120 may also be configured as a layer stack comprising several layers. In the context of the present disclosure, the feature "first semiconductor layer stack comprising a first semiconductor layer of a first conductivity type" also includes the option of the first semiconductor layer stack comprising only one single first semiconductor layer.

The uppermost or outermost layer 110 of the first semiconductor layer stack 111 may represent a connecting layer, for example. The connecting layer may be embodied, for example, in such a manner that it has a higher conductivity than other layers within the first semiconductor layer stack 111. The uppermost or outermost layer 110 may, for example, have a higher doping than other layers within the first semiconductor layer stack 111. According to further embodiments, the uppermost or outermost layer 110 may have a different composition ratio than other layers within the first semiconductor layer stack 111. Furthermore, the connecting layer may have a low absorption, for example a lower absorption than a conductive metal oxide layer such as an indium tin oxide layer. For example, it may have a layer thickness of approximately 80 to 120 nm. The first semiconductor layer stack 111 may have a layer thickness of 3 to 3.5 μm, for example. The second semiconductor layer 120 may have a layer thickness of 1.5 to 2 μm.

The light emitting surface of an optoelectronic semiconductor device, i.e., the first main surface 112 of the first semiconductor layer stack 111, is usually patterned or roughened in order to increase the outcoupling efficiency. As a result of this patterning, a plurality of protruding areas 113 is formed.

According to embodiments, the first contact element 125 may be adjacent to a patterned part of the first main surface 112 of the first semiconductor layer stack 111. According to further embodiments, the first main surface 112 of the first semiconductor layer stack 111 may also be unpatterned in a region in which it is adjacent to the first contact element 125 and may form a planar surface. Depressions 114 are usually formed between the adjacent protruding regions 113. The depressions 114 may extend to different depths t within the first semiconductor layer stack 111. For example, a depth t of the depressions 114 may be 500 nm to 2 μm or, depending on the material system, up to 3 μm, wherein a depth t of the depressions 114 is measured from the upper edge of the first main surface 112. The protruding regions 113 may also be arranged adjacent to a depression 114 in a direction perpendicular to the sectional plane shown. That is to say, protruding regions 113 are usually surrounded by depressions 114 in two horizontal directions. Generally, in the context of the present disclosure, protruding regions 113 are generally regions of the first semiconductor layer stack 111 that protrude from one or more adjacent depressions 114. For example, a height of the protruding regions 113 may be different in each case. Furthermore, a horizontal extension may be different in each case.

A material of the second contact element 129 may be identical to or different from the material of the first contact element 125. According to embodiments illustrated in FIG. 2A, the second contact element 129 may be arranged on a side of the second semiconductor layer 120 facing away from the active zone.

FIG. 2A further illustrates a hypothetical current flow 117 schematically starting from the first contact element 125. As shown in FIG. 2A, current spreading occurs, in particular, first in the vertical direction and then in the horizontal direction. That is to say, with the patterning of the first main surface 112 shown in FIG. 2A, current spreading occurs over regions below the depression 114.

Figure 2B:
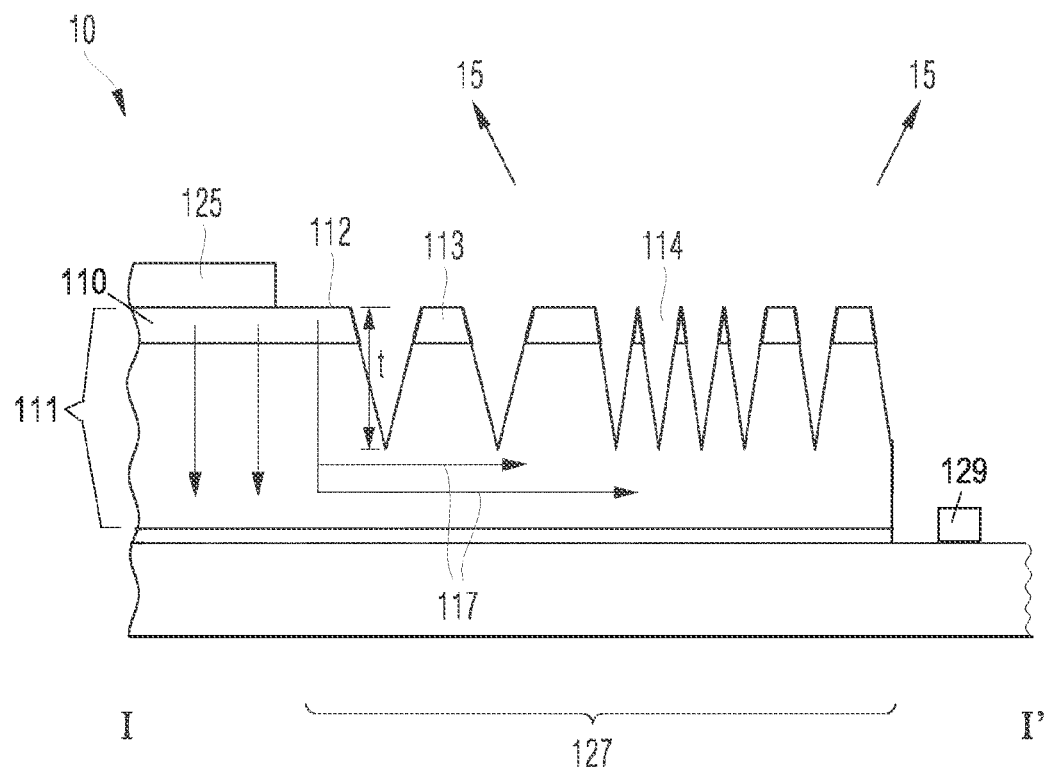
FIG. 2B shows a schematic cross-sectional view of part of an optoelectronic semiconductor device according to further embodiments.

FIG. 2B shows a cross-sectional view of the optoelectronic semiconductor device between I and I' in accordance with further embodiments. The embodiments shown in FIG. 2B differ from the embodiments shown in FIG. 2A in particular by the changed position of the second contact element 129. As shown in FIG. 2B, the second contact element 129 is, in this case, arranged on the side of the second semiconductor layer 120 facing towards the first main surface 112 of the semiconductor layer stack 111.

Figure 3A:
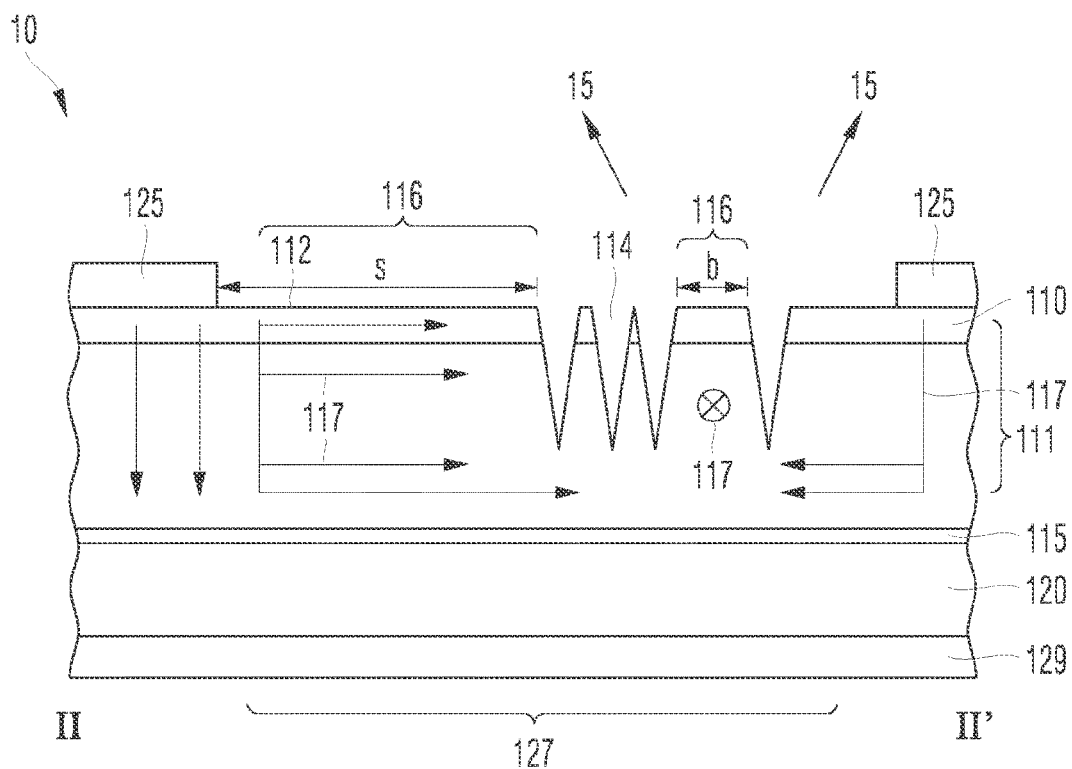
FIGS. 3A and 3B are schematic cross-sectional views of part of an optoelectronic semiconductor device according to embodiments.

FIG. 3A shows a cross-sectional view of the optoelectronic semiconductor device between II and II', as shown, for example, in FIG. 1B.

As shown in FIG. 3A, part of the first main surface 112 of the first semiconductor layer stack 111 is patterned in such a manner that connecting regions 116 are formed as explained above. For example, the connecting regions 116 may be unpatterned regions of the semiconductor layer stack 111. The connecting regions are adjacent to regions in which part of the first main surface 112 of the first semiconductor layer stack is adjacent to the first contact element 125.

As is also shown in FIG. 3A, in this arrangement, the current flow 117 may also take place via regions of the semiconductor layer stack 111 which are in the vicinity of the first main surface 112. In this manner, the current impression may be improved. As is shown in the left-hand part of FIG. 3A, the connecting regions 116 may extend, on the one hand, in the x direction (see FIG. 1B). The connecting region or further connecting regions may also extend in the y direction. In this case, a current flow 117 may take place in a direction perpendicular to the plane of representation, as indicated in the right-hand part of FIG. 3A.

FIG. 3A further illustrates a lateral extension (length) s in the direction of extension of the connecting regions and a lateral extension (width) b perpendicular thereto.

As illustrated in FIG. 3A, the connecting regions may be implemented by unpatterned regions of the first semiconductor layer stack 111. For example, the connecting regions 116 may be implemented by parts of the top or final semiconductor layer 110. The uppermost semiconductor layer 110 may thus represent a connecting layer which has been grown epitaxially. The connecting region 116 may be of the first conductivity type. Electromagnetic radiation generated by the optoelectronic semiconductor device may be able to be coupled out via the connecting region 116. That is to say, the electromagnetic radiation 15 generated is absorbed by the connecting regions only to a small extent or not at all. For example, the connecting region may not contain any layer that has not been epitaxially grown. Furthermore, a surface of the connecting region may be free of any non-epitaxially grown layer.

Figure 3B:
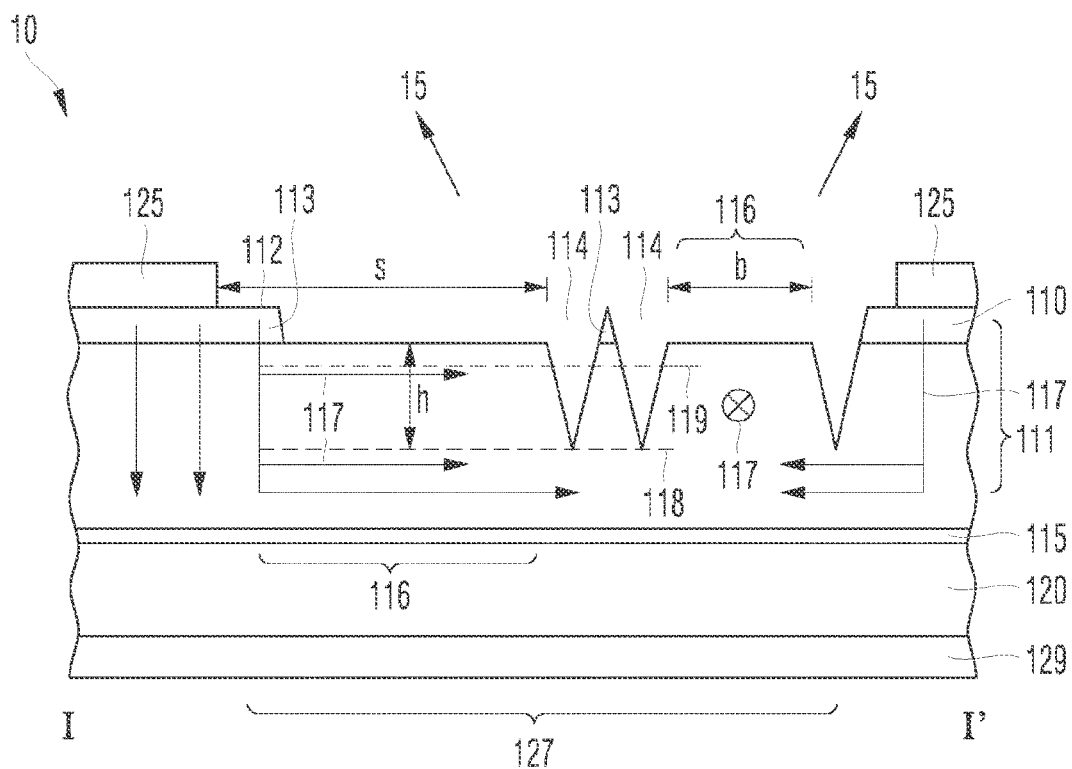

According to further embodiments, as shown, for example, in FIG. 3B, the connecting regions 116 may also correspond to a patterned part of the first semiconductor layer stack 111. In FIG. 3B, the same reference numerals indicate the same components as in FIG. 3A. In contrast to FIG. 3A, however, the uppermost or outermost layer 110 of the semiconductor layer stack 111 is additionally patterned, so that, as a result, the connecting region 116 is provided by a partially patterned semiconductor layer stack 111. For example, a structural height h of the connecting region 116 may be greater than one half of the mean structural height 119 of the protruding regions 113. The structural height of the connecting region and the averaged structural height are determined in each case in relation to a horizontal reference plane 118. For example, the horizontal reference plane 118 may be that horizontal plane which corresponds to a termination plane of the deepest depressions 114 or the median of the depressions 114. Furthermore, the mean structural height of the protruding regions may be an average of the structural heights in relation to this reference plane 118.

As shown in FIG. 3B, protruding regions 113 are patterned in the uppermost semiconductor layer 110. According to this embodiment, the current may flow through a large part of the depth of the semiconductor layer stack 111 within the connection region 116.

For example, in the embodiment shown in FIG. 3B, a semiconductor layer arranged below the uppermost or outermost semiconductor layer 110 may represent the connecting layer. According to embodiments, the uppermost or outermost semiconductor layer 110 may be completely removed in the light emitting region. For example, the uppermost or outermost semiconductor layer 110 may be patterned in such a manner that it has the same or approximately the same lateral extension as the first contact element. Alternatively, the uppermost or outermost semiconductor layer may be thinned in the connection regions 116 and represent the connection layer.

FIG. 3B further illustrates a lateral extension (length) s in the direction of extension of the connecting regions and a lateral extension (width) b perpendicular thereto.

For example, the first semiconductor layer stack may comprise phosphide semiconductor layers. Furthermore, the uppermost or outermost semiconductor layer 110 may be a phosphide semiconductor layer. For example, the material system may be an InGaAlP layer system.

According to further embodiments, a semiconductor material of the first semiconductor layer stack may comprise a nitride or arsenide semiconductor material.

According to an alternative approach, an optoelectronic semiconductor device 10 comprises a first semiconductor layer stack 111 comprising a first semiconductor layer of a first conductivity type and an epitaxial connecting layer, as well as a second semiconductor layer 120 of a second conductivity type. The optoelectronic semiconductor device 10 further comprises a first contact element 125 and a second contact element 129. The first semiconductor layer stack 111 and the second semiconductor layer 120 are arranged one above the other. The second semiconductor layer 120 is electrically connected to the second contact element 129. Part of a first main surface 112 of the first semiconductor layer stack 111 is adjacent to the first contact element 125. Part of the first main surface 112 of the first semiconductor layer stack 111 is patterned so that a plurality of protruding regions 113 and a plurality of connecting regions 116 are formed. Part of that part of the first main surface 112 that is patterned is not adjacent to the first contact element 125 and represents a light emitting region 127. The connecting regions 116 each extend from the first contact element 125 into the light emitting region 127.

For example, the connecting regions 116 are adjacent to areas in which part of the first main surface 112 of the first semiconductor layer stack 111 is adjacent to the first contact element 125.

Figure 4:
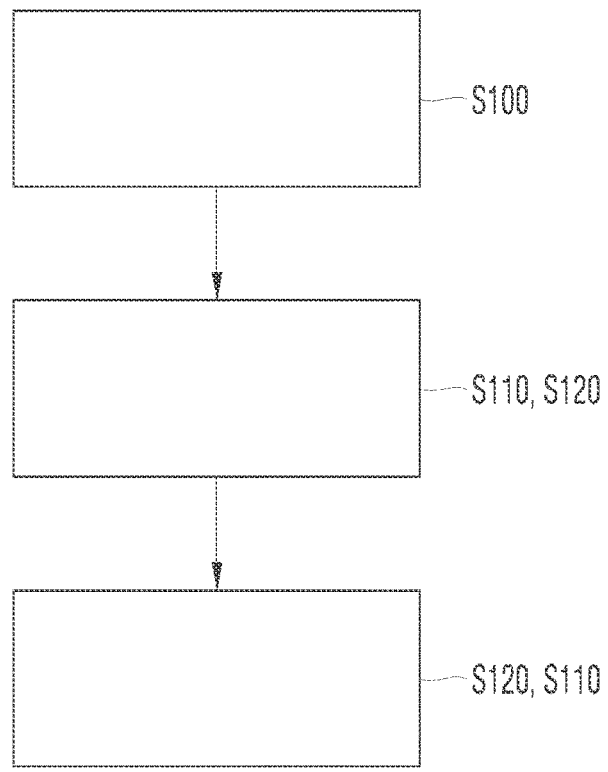
FIG. 4 outlines a method according to the embodiment.

FIG. 4 outlines a method according to embodiments. A method for manufacturing an optoelectronic semiconductor device comprises forming (S100) a first semiconductor layer stack comprising first semiconductor layers of a first conductivity type and a second semiconductor layer of a second conductivity type. The method further comprises forming (S110) a first contact element and a second contact element. The first semiconductor layer stack and the second semiconductor layer are arranged one above the other. The second semiconductor layer is electrically connected to the second contact element, wherein part of a first main surface of the first semiconductor layer stack is adjacent to the first contact element. The method further comprises patterning (S120) a part of the first main surface of the first semiconductor layer stack, so that a plurality of protruding regions and a plurality of connecting regions are formed, wherein the connecting regions are adjacent to regions in which part of the first main surface of the first semiconductor layer stack is adjacent to the first contact element, and have a lateral extension that is greater than 5 times the mean lateral extension of the protruding regions.

For example, forming (S110) the first contact element may take place before patterning (S120) the part of the first main surface. According to further embodiments, forming (S110) the first contact element may also be carried out after patterning (S120) the part of the first main surface.

According to embodiments, patterning of the first main surface of the first semiconductor layer stack may take place using photolithographic processes. A photomask may be constructed or patterned in such a manner that the depressions 114 are formed such that a plurality of protruding regions 113 and a plurality of connecting regions 116 may be patterned.

As the first main surface 112 is patterned as described, it is possible, on the one hand, to achieve good out-coupling of generated electromagnetic radiation and good injection of electric current, on the other hand. As a result, the voltage drop across the optoelectronic semiconductor device is reduced. As a result, the efficiency of the optoelectronic semiconductor device may be increased.

Although specific embodiments have been illustrated and described herein, those skilled in the art will recognize that the specific embodiments shown and described may be replaced by a multiplicity of alternative and/or equivalent configurations without departing from the scope of the invention. The application is intended to cover any adaptations or variations of the specific embodiments discussed herein. Therefore, the invention is to be limited by the claims and their equivalents only.

The invention claimed is:

1. An optoelectronic semiconductor device, comprising:
a first semiconductor layer stack comprising a first semiconductor layer of a first conductivity type, wherein a layer which is directly adjacent to a first main surface of the first semiconductor stack is epitaxial,
the optoelectronic semiconductor device further comprising a second semiconductor layer of a second conductivity type,
a first contact element and a second contact element,
wherein the first semiconductor layer stack and the second semiconductor layer are arranged one above the other,
the second semiconductor layer is electrically connected to the second contact element, and
wherein part of the first main surface of the first semiconductor layer stack is directly adjacent to the first contact element and part of the first main surface of the first semiconductor layer stack is patterned so that a plurality of protruding regions and a plurality of connecting regions are formed, the connecting regions being directly adjacent to regions in which part of the first main surface of the first semiconductor layer stack is directly adjacent to the first contact element, and the connecting regions having a lateral extension which is greater than 5 times the mean lateral extension of the protruding regions,
wherein at least one of the connecting regions is a light emitting region that is not covered with a conductive material.

2. The optoelectronic semiconductor device according to claim 1, wherein the first semiconductor layer stack comprises at least two layers and the connecting regions are formed in the first semiconductor layer.

3. The optoelectronic semiconductor device according to claim 1, wherein the first semiconductor layer has a higher conductivity than other layers of the semiconductor stack.

4. The optoelectronic semiconductor device according to claim 1, wherein the first contact element comprises an electrically conductive material and part of that part of the first main surface that is patterned is not adjacent to the first contact element and represents a light emitting region.

5. The optoelectronic semiconductor device according to claim 1, wherein the connecting regions extend from the first contact element into the light emitting region, respectively.

6. The optoelectronic semiconductor device according to claim 1, wherein the first contact element encloses the light emitting region.

7. The optoelectronic semiconductor device according to claim 1, wherein at least one of the connecting regions extends up to a position within the light emitting region from which a distance to a closest part of the first contact element is greater than one third of a smallest diameter of the light emitting region.

8. The optoelectronic semiconductor device according to claim 1, wherein an outermost semiconductor layer of the first semiconductor layer stack is at least partially removed or thinned in the light emitting region.

9. The optoelectronic semiconductor device according to claim 1, wherein a lateral extension of the connecting regions in a direction perpendicular to an extension direction is greater than a mean lateral extension of the protruding regions.

10. The optoelectronic semiconductor device according to claim 1, wherein a structural height of one of the connecting regions is greater than half a mean lateral extension of the protruding regions.

11. The optoelectronic semiconductor device according to claim 1, wherein the first semiconductor layer stack comprises phosphide semiconductor layers and an outermost first semiconductor layer contains a phosphide semiconductor material.

12. The optoelectronic semiconductor device according to claim 1, wherein a semiconductor material of the first semiconductor layer stack comprises a nitride or arsenide semiconductor material.

13. The optoelectronic semiconductor device according to claim 1, wherein a region between two protruding regions has a vertical depth greater than 500 nm and less than 3 µm.

14. A method for manufacturing an optoelectronic semiconductor device, comprising:
forming a first semiconductor layer stack comprising a first semiconductor layer of a first conductivity type, wherein a layer which is directly adjacent to a first main surface of the first semiconductor layer stack is epitaxial,
forming a second semiconductor layer of a second conductivity type, wherein a layer which is directly adjacent to a first main surface of the first semiconductor layer stack is epitaxial,
forming a first contact element and a second contact element,
wherein the first semiconductor layer stack and the second semiconductor layer are arranged one above the other,
the second semiconductor layer is electrically connected to the second contact element, and
wherein part of the first main surface of the first semiconductor layer stack is directly adjacent to the first contact element and the method further comprises
patterning a part of the first main surface of the first semiconductor layer stack, so that a plurality of protruding regions and a plurality of connecting regions are formed, the connecting regions being directly adjacent to regions in which a part of the first main surface of the first semiconductor layer stack is directly adjacent to the first contact element, the connecting regions having a lateral extension which is greater than 5 times the mean lateral extension of the protruding regions, wherein at least one of the connecting regions is a light emitting region that is not covered with a conductive material.

15. The method according to claim 14, wherein the patterning is carried out photolithographically using a photomask.

16. The method of claim 14, further comprising removing at least part of an outermost layer of the semiconductor layer stack.

17. An optoelectronic semiconductor device comprising:

a first semiconductor layer stack comprising a first semiconductor layer of a first conductivity type and an epitaxial connecting layer which is directly adjacent to a first main surface of the first semiconductor layer stack, the optoelectronic semiconductor device further comprising a second semiconductor layer of a second conductivity type, a first contact element and a second contact element, wherein the first semiconductor layer stack and the second semiconductor layer are arranged one above the other, the second semiconductor layer is electrically connected to the second contact element, and wherein part of a first main surface of the first semiconductor layer stack is directly adjacent to the first contact element, and part of the first main surface of the first semiconductor layer stack is patterned so that a plurality of protruding regions and a plurality of connecting regions are formed, part of that part of the first main surface that is patterned is not directly adjacent to the first contact element and represents a light emitting region, and the connecting regions extend from the first contact element into the light emitting region, respectively, and at least one of the connection regions represents a light-emitting region that is not covered with a conductive material.

18. The optoelectronic semiconductor device according to claim 17, wherein the connecting regions are directly adjacent to regions in which part of the first main surface of the first semiconductor layer stack is directly adjacent to the first contact element.

* * * * *